United States Patent [19]

Takigawa et al.

[11] Patent Number: 5,031,186
[45] Date of Patent: Jul. 9, 1991

[54] SEMICONDUCTOR LASER DEVICE

[75] Inventors: Shinichi Takigawa, Osaka; Masahiro Kume, Ootsu; Hirokazu Shimizu, Osaka, all of Japan

[73] Assignee: Matsushita Electric Industrial Co., Ltd., Japan

[21] Appl. No.: 494,075

[22] Filed: Mar. 15, 1990

[30] Foreign Application Priority Data

| Mar. 15, 1989 | [JP] | Japan | 1-62496 |
| Jun. 7, 1989 | [JP] | Japan | 1-143032 |
| Jun. 14, 1989 | [JP] | Japan | 1-151834 |
| Oct. 30, 1989 | [JP] | Japan | 1-282101 |

[51] Int. Cl.$^5$ .............................. H01S 3/19
[52] U.S. Cl. .............................. 372/49
[58] Field of Search .............................. 372/49

[56] References Cited

FOREIGN PATENT DOCUMENTS 0230076 10/1987 Japan .............................. 372/49
0260381 11/1987 Japan .............................. 372/49

OTHER PUBLICATIONS

Ladany et al., "Al$_2$O$_3$ Half-Wave Films for Long-Life CW Lasers", Applied Physics Lett., vol. 30, No 2, Jan. 15, 1977; pp. 87-88.

Primary Examiner—Georgia Epps
Attorney, Agent, or Firm—Lowe, Price, LeBlanc & Becker

[57] ABSTRACT

A semiconductive laser device having a resonator which is formed with a dielectric film on at least one end face thereof is described. The dielectric film is in a thickness of at least three times a wavelength in the dielectric film by which the oscillation wavelength becomes very stable.

11 Claims, 8 Drawing Sheets

SEMICONDUCTOR LASER DEVICE

BACKGROUND OF THE INVENTION

1. Field of the Invention

This invention relates to a semiconductive laser device for optical information processing and optical communication.

2. Description of The Related Art

Semiconductive devices used in optical information processing and optical communication should have a stable oscillation frequency relative to the variation in temperature and/or optical output. In ordinary Fabry-Perot type semiconductive devices, there is no difference between the threshold gains in the oscillatory longitudinal modes or there is no selectivity in wavelength, so that the oscillation wavelength is substantially determined by a gain peak wavelength of an active layer. The gain peak wavelength of the active layer depends greatly on the temperature, resulting in a great variation of the oscillation wavelength depending on the temperature. In order to solve this problem, it is necessary to add a difference in the threshold gain between the respective longitudinal modes. To this end, there has been conventionally used a distributed feedback structure as shown in FIG. 1. In the figure, there is shown a double-hetero structure comprised of an active layer 3 and clad layers 2, 5 wherein a guide layer 4 is provided between the active layer 3 and the clad layer 5. A diffraction grating 16 is also provided between the guide layer 4 and the clad layer 5. The longitudinal modes in the vicinity of the Bragg wavelength which is determined from a diffraction grating cycle and a refractive index are such that the reflection with the diffraction grating is increased with a lowering of the threshold gain of the laser oscillation. Accordingly, a difference in the threshold gain is added to the respective longitudinal modes, ensuring a stable oscillation wavelength relative to the variation in temperature and/or optical output.

However, the distributed feedback structure is very difficult to fabricate and is not advantageous from the industrial viewpoint.

SUMMARY OF THE INVENTION

It is accordingly an object of the invention to provide a semiconductive laser device which can solve the above problems and which enables one to obtain a stable oscillation wavelength by an industrially easy way.

The above object can be achieved, according to the invention, by a semiconductive laser device of the type which comprises at least one optical resonator having a dielectric film formed on at least one end face of the resonator from which a laser beam is emitted. The dielectric film has a thickness which is not less than three times a wavelength of the laser beam in the dielectric film whereby the oscillation wavelength of the semiconductive laser can be stabilized. The dielectric film with a controlled thickness can be readily formed by any known technique industrially used for this purpose.

When a dielectric film is formed on the beam emission surface of the resonator of a semiconductive laser device, the reflectivity, R, at the beam emission surface is given by the following equation (1)

$$R = 1 - 2\beta/(\alpha + \beta + \gamma \cdot \cos \delta) \qquad (1)$$

wherein
$\alpha = (n_0^2 + n_1^2) \cdot (n_1^2 + 1)$
$\beta = 4 n_0 n_1^2$
$\gamma = (n_0^2 - n_1^2) \cdot (n_1^2 - 1)$ in which $n_0$ is a refractive index of the semiconductive laser device, and $n_1$ is a refractive index of the dielectric film, both being independent of wavelength, and $$\delta = 4\pi n_1 t / \lambda \qquad (2)$$

in which t is a thickness of the dielectric film and $\lambda$ is a wavelength oscillated from the laser device.

Thus, $\delta$ is a function of wavelength, and the reflectivity, R, also becomes a function of wavelength. On the other hand, the gain, $g_{th}$, of oscillation threshold value of the semiconductive laser device is given according to the following equation (3)

$$g_{th} = \alpha_{in} + \tfrac{1}{2} L \cdot \ln 1/(R_1 \cdot R_2) \qquad (3)$$

wherein $\alpha_{in}$ is an internal loss, L is a length of the resonator, and $R_1$ and $R_2$ are, respectively, a reflectivity at the beam emission surface. Assuming that $\alpha_{in}$ and $R_2$ are not a function of wavelength, respectively, and that $R_1$ is the case wherein the dielectric film is formed on the beam emission surface as is shown in the equation (1), the threshold gain becomes a function of wavelength from the equations (1), (2) and (3). Hence, the oscillation of the semiconductive laser device takes place at a wavelength at which the threshold gain is minimized, and the wavelength will be determined from the equations (1) to (3) as follows.

$$\lambda = 2 n_1 d / (\text{integer}) \qquad (4)$$

When the wavelength of the laser device is varied by $\Delta \lambda$, the threshold gain is varied by $\Delta g_{th}$ from the equations (1) to (3), approximately giving the following equation (5)

$$\Delta g_{th} = 2\pi^2 \gamma / L\beta \cdot (1-R)^2 / R \cdot (\Delta\lambda/\lambda)^2 \cdot \{d/(\lambda/n_1)\}^2 \qquad (5)$$

With ordinary semiconductive laser devices,

L ~ 250 μm
$\gamma/\beta \leq (n_0 - 1)^2 / 4 n_0 = 0.47$

R ~30%, and $\lambda = 800$ nm. Since the variation of $\Delta\lambda \sim 10$ nm presents a problem, the equation (5) will become $$\Delta g_{th} \leq 0.1 \cdot \{d/(\lambda/n_1)\}^2 \qquad (6)$$

In order to stabilize the oscillation wavelength, $\lambda$, the value of $\Delta g_{th}$ should be not less than 1 cm$^{-1}$. From the equation (6), $d \leq 3(\lambda/n_1) = 3 \times$ (wavelength in the dielectric film). This is the reason why the oscillation wavelength of the semiconductive laser device can be stabilized by forming a dielectric film on the beam emission surface and making its thickness not less than three times the wavelength in the dielectric film.

DETAILED DESCRIPTION AND EMBODIMENTS OF THE INVENTION

Figure 2:
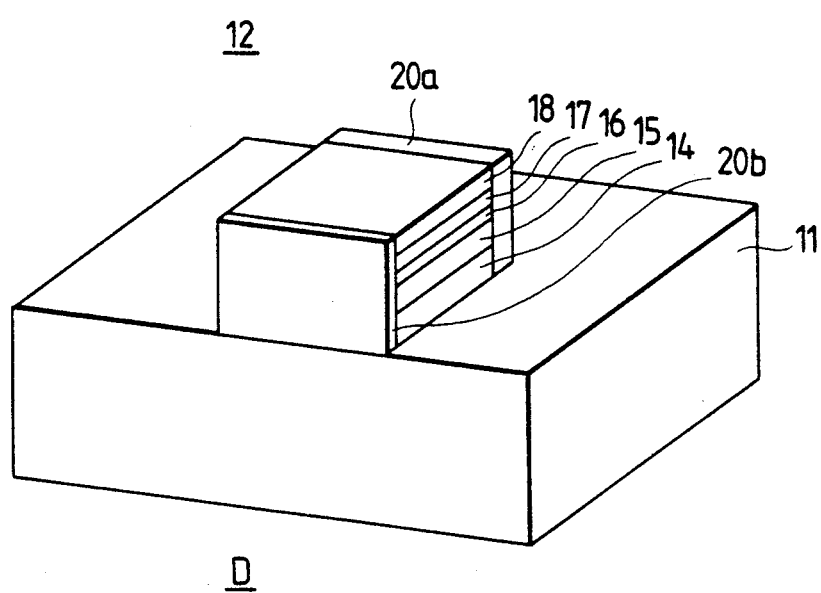
FIG. 2 is a schematic perspective view of a semiconductive laser device according to a first embodiment of the invention.

Reference is now made to the accompanying drawings and particularly, to FIG. 2, wherein a semiconductive laser device according to one embodiment of the invention is generally shown as D. The device D is of the Fabry-Perot type made, for example, of a GaAlAs semiconductive laser device and includes, for example, a Si sub-mount 11 and a laser chip or resonator 12 mounted on the sub-mount 11. The chip 12 has a p-GaAs substrate 14, a p-$Ga_{0.5}Al_{0.5}As$ clad layer 15, a $Ga_{0.87}Al_{0.13}AS$ active layer 16, an n-$Ga_{0.5}Al_{0.5}As$ clad layer 17, and an n-GaAs contact layer formed on the substrate 14 in this order. In the practice of the invention, a dielectric film 20a on one end surface of the device from which a laser beam is to be emitted. The film 20a is formed in an optical length, for example, of 9. The optical length is defined by dielectric film thickness/wavelength in the dielectric film. At the other end face, an $Al_2O_3$ dielectric film 20b is provided in a thickness of 0.5 in order to protect the end face. The reflectivity is approximately 32% and exhibits little dependency on wavelength.

Figure 3A:
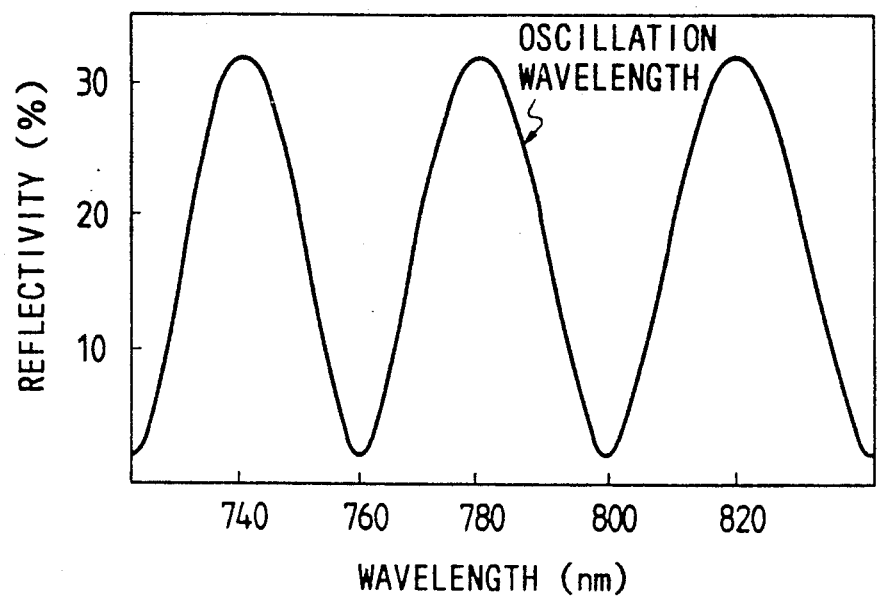
FIGS. 3a and 3b are, respectively, graphical representations, as calculated, of the reflectivity at an end face of the semiconductive laser device according to the first embodiment of the invention and the difference in threshold gain in relation to the variation in oscillation wavelength.
Figure 3B:
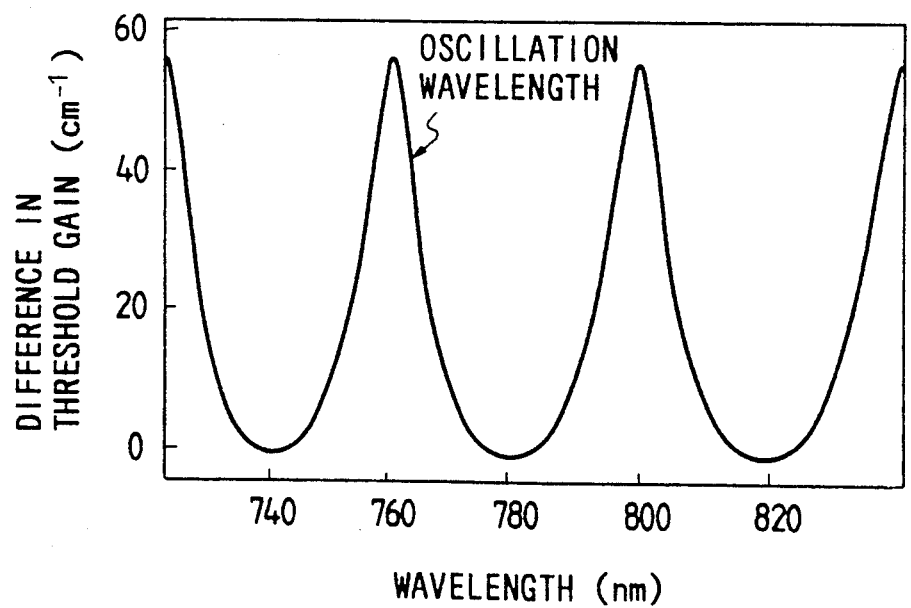

In FIGS. 3a and 3b, there are, respectively, shown calculated results of reflectivity at an end face of the semiconductive laser device and a difference in threshold gain for different modes in relation to the wavelength. These values are calculated using the afore-indicated equations (1) to (3). The difference in the threshold gain indicates a difference from a threshold gain at a wavelength of 780 nm.

In these figures, the dielectric film is made of $Al_2O_3$ having a refractive index of 1.65 and has a thickness of nine times a wavelength in the dielectric film (which wavelength is a stabilized wavelength). The cavity length is 250 μm. FIG. 3b reveals that the threshold gain at a wavelength shifted from 780 nm by ±10 nm is greater by about 23 cm$^{-1}$ than that at 780 nm. Accordingly, when the gain peak of the active layer is varied by ±10 nm as will be caused by a temperature variation, the wavelength can be stabilized at 780 nm.

The wavelength dependence of the reflectivity of the semiconductive device described above is as shown in FIG. 3a.

Figure 4:
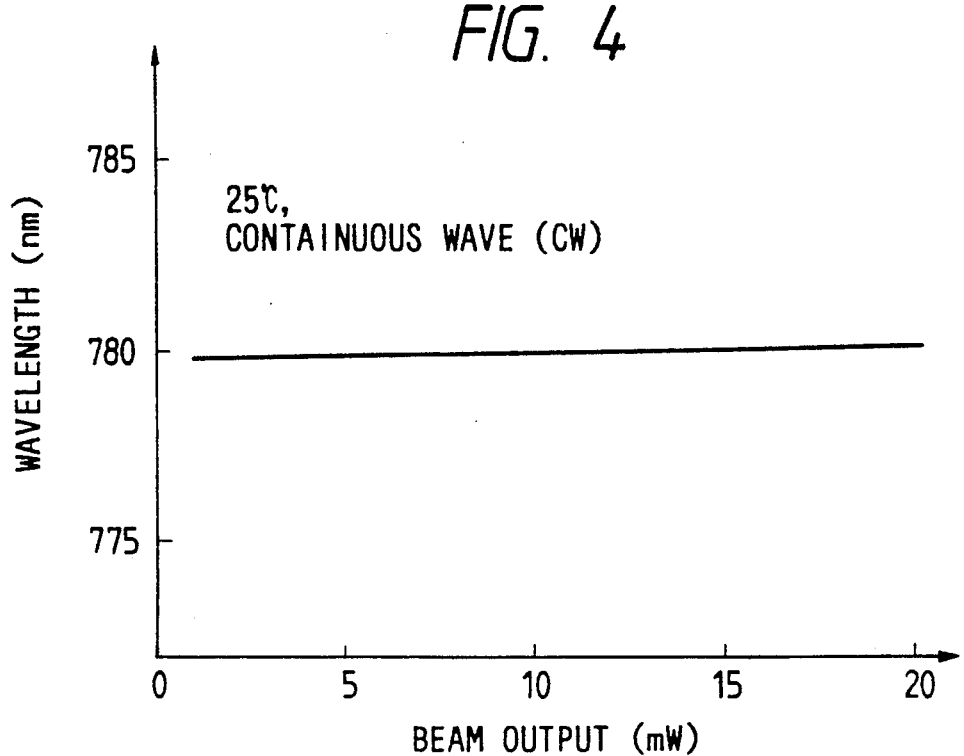
FIG. 4 is a graphical representation of the oscillation wavelength of the semiconductive device of the invention in relation to the variation in beam output.
Figure 5:
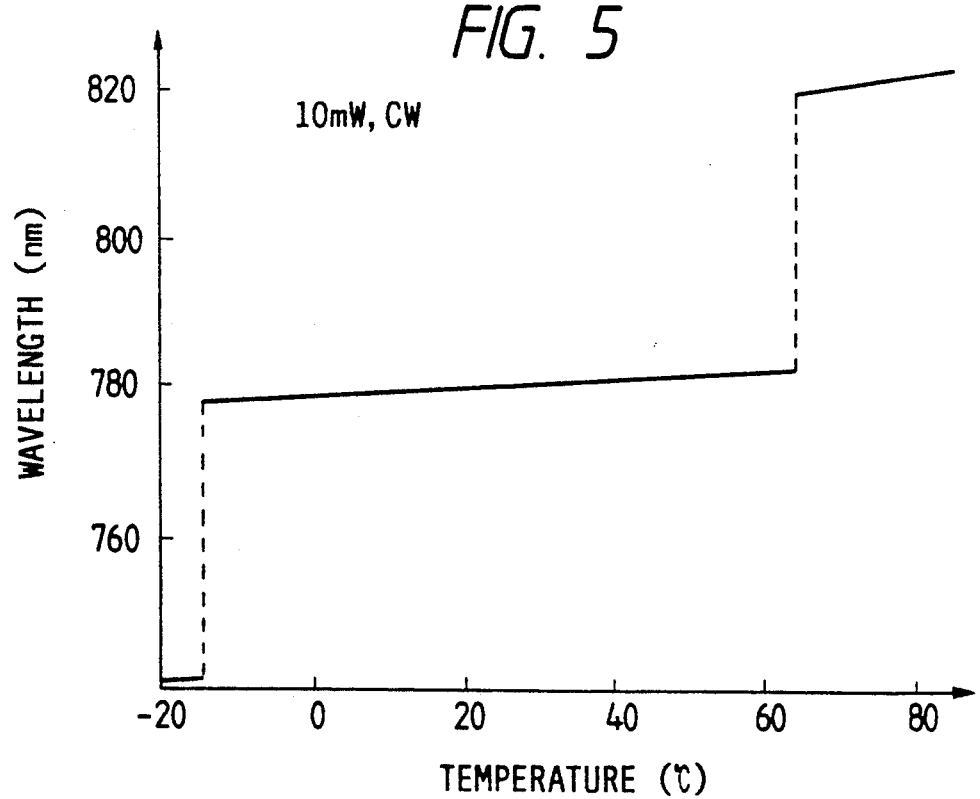
FIG. 5 is a graphical representation of the oscillation wavelength of the semiconductive device of the invention in relation to the variation in temperature.

FIG. 4 shows an oscillation wavelength in relation to the variation in beam output of the device described above under conditions of 25° C. From the figure, it will be seen that the oscillation wavelength is kept substantially constant at 780 nm at which the threshold value is minimized. FIG. 5 shows the temperature dependence of the oscillation wavelength at beam output power of 10 mW, revealing that the wavelength is stabilized within a temperature range of about 80° C.

Aluminium oxide is used as the dielectric film, and other known metal oxides such as titanium oxide, silicon oxide and the like may likewise used in the practice of the invention.

Figure 6:
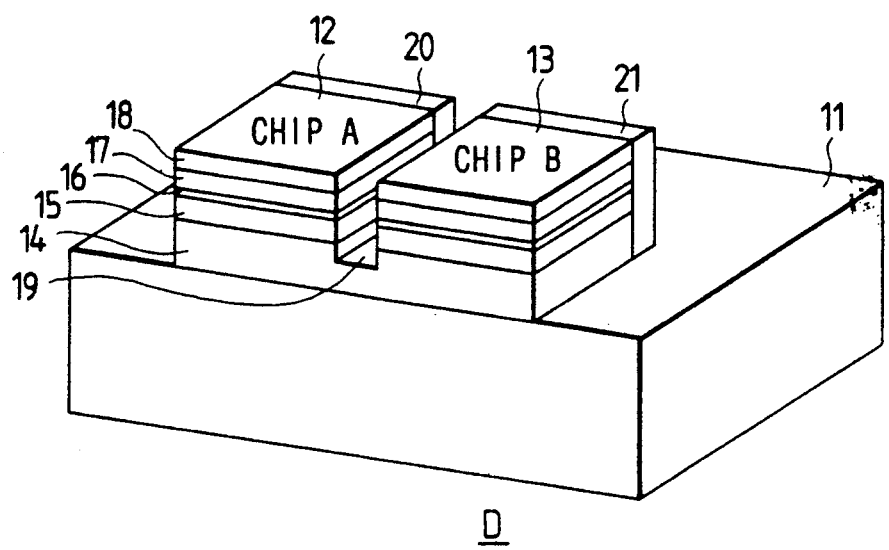
FIG. 6 is a schematic perspective view of the multiple beam semiconductive laser device according to a second embodiment of the invention.

The second embodiment of the invention is described with reference to FIGS. 6 and 7. In FIG. 6, like reference numerals as used in FIG. 1 indicate like parts. FIG. 6 shows a multiple beam semiconductive laser device $\underline{D}$ including resonator chips 12, 13 adjacently formed on a wafer or sub-mount 11 made, for example, of Si. Each chip is made, for example, of the Fabry-Perot type GaAlAs semiconductive laser element. This element is particularly described below. The chip 12 or 13 has a p-GaAs substrate 14, a p-$Ga_{0.5}Al_{0.5}As$ clad layer 15, a $Ga_{0.87}Al_{0.13}As$ active layer 16, an n-$Ga_{0.5}Al_{0.5}As$ clad layer 17 and an n-GaAs contact layer 18. The two chips shown in the figure are separated from each other with a groove 16 which reaches the p-GaAs substrate 14. Reference numerals 20, 21, respectively, indicate dielectric films formed on the respective end surfaces of the chips 12, 13, from which a laser beam is to emitted. The chips 12 and 13 are arranged to have the same cleavage face so that the optical axes of laser beams emitted therefrom become parallel to each other.

The maximum gain wavelength of the $Ga_{0.87}Al_{0.13}As$ active layer 16 is 790 nm. In general, the gain width of the active layer is approximately 30 nm, with a possible oscillation wavelength range of from 775 to 805 nm. Accordingly, the thicknesses of the dielectric films 20, 21 are so controlled that the semiconductive laser chips 12, 13 are capable of emitting laser beams having oscillation wavelengths of 775 nm and 805 nm. The oscillation wavelength is proportional to the thickness of the dielectric film as shown in the afore-indicated equation (4). To attain the above oscillation wavelengths, it is sufficient to make the thickness of the dielectric film 20 smaller by about 3.9%, i.e. (805−775)/805×100, than the thickness of the dielectric film 21.

Figure 7:
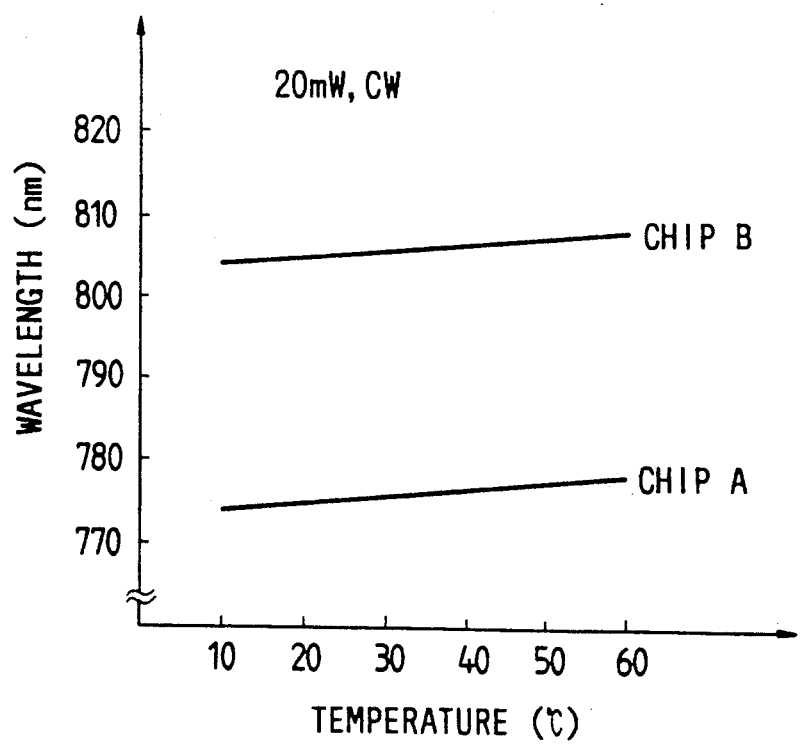
FIG. 7 is a graphical representation of the oscillation wavelength in relation to the variation in temperature.

When the dielectric films 20, 21 are each made of aluminum oxide having a refractive index of 1.66 and thicknesses of 2.425 μm (with an optical length relative to the wavelength of 805 nm being 5) and 2.425

μm×(1−3.9/100)=2.330 μm (with an optical length relative to the wavelength of 805 nm being 4.81), the temperature dependence of the oscillation wavelength in this laser device at a laser output of 20 mw is shown in FIG. 7. In this case, the oscillation wavelengths from the laser chips 12, 13 are, respectively, 775 nm and 805 nm. Since the oscillation wavelength is fixed at an oscillation mode wavelength which is determined by the thickness of the aluminium oxide film, any mode hopping does not take place.

In this embodiment, the dielectric films formed on adjacent semiconductive laser chips with the same structure should have a thickness of at least three times the wavelength in the film, by which a multiple beam semiconductive laser device having different oscillation wavelengths and parallel optical axes can be obtained. As a matter of course, a plurality of chips may be formed on the same wafer so that a plurality of laser beams can be emitted. Moreover, the dielectric film having a double or multi-layered structure may be formed on opposite end surfaces of the respective chips as is particularly shown in FIG. 1.

Figure 1:
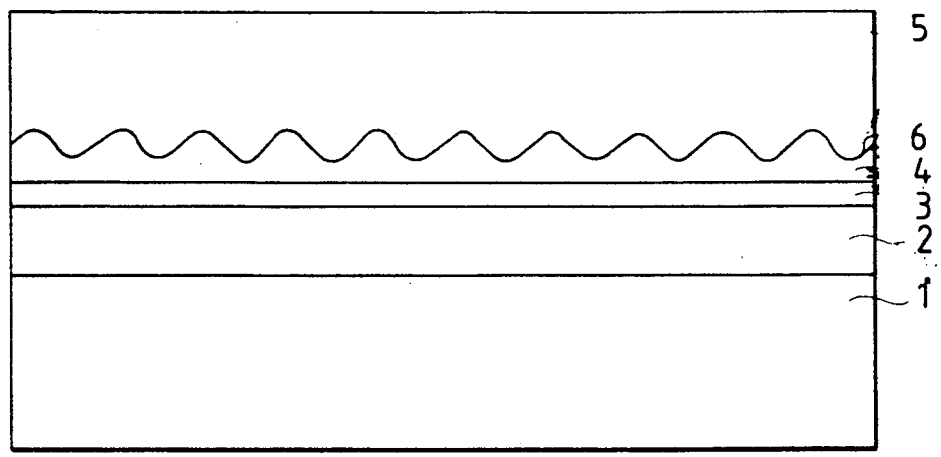
FIG. 1 is a schematic side view of a known wavelength-stabilized semiconductive laser device.

In accordance with a third embodiment of the invention, the dielectric film indicated as 20a, 20 or 21 in FIGS. 1 and 6 and formed at the end face from which a laser beam is emitted has a two-layered structure. The first layer which contacts the end face is made of a metal oxide having a high refractive index and including, for example, $TiZrO_4$, $SiO_2$, $TiO_2$ and the like. A second layer formed on the first layer is made, for example, of $Al_2O_3$ and the like defined before. In this case, the second layer should have a thickness of at least three times a wavelength in the film.

A semiconductive laser device of a similar type as is described with reference to FIG. 1 is fabricated using a double-layered structure. The structure is made of a first layer contacting the end face and made of $TiZrO_4$ having a refractive index of 1.9 and an optical length of 0.25 and a second layer of $Al_2O_3$ having a refractive index of 1.65 and an optical length of 9.25. The thickness of the second layer is sufficient to meet the requirement mentioned above. The cavity length is 250 μm. The laser device is designed to minimize the threshold gain (or to maximize reflectivity) at a wavelength of 780 nm.

Figure 8A:
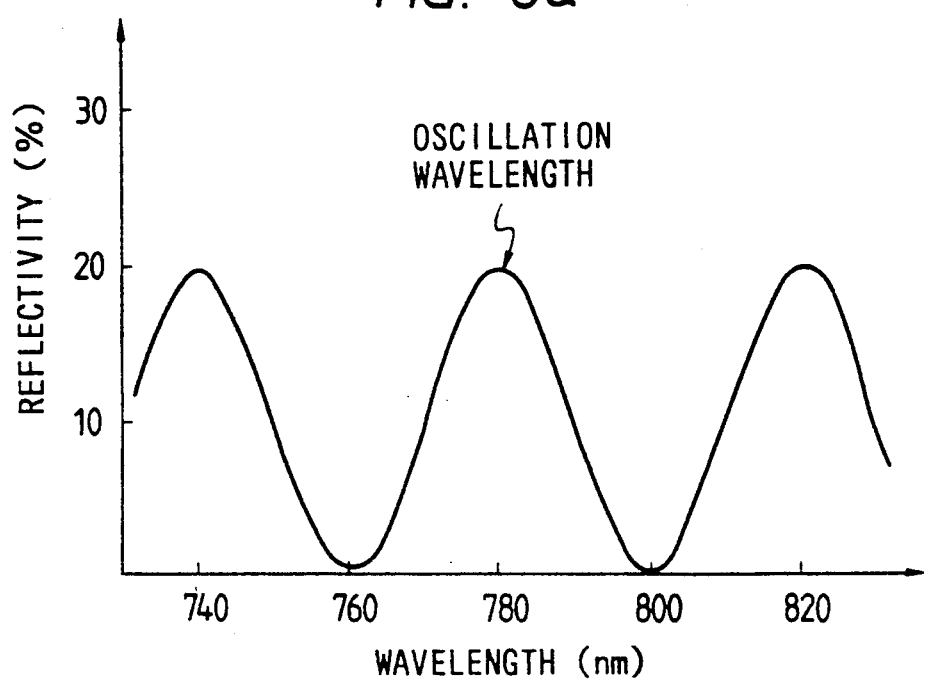
FIGS. 8a and 8b are, respectively, graphical representations of the reflectivity and longitudinal mode threshold gain of a semiconductive device according to a third embodiment of the invention in relation to the variation in oscillation wavelength.
Figure 8B:
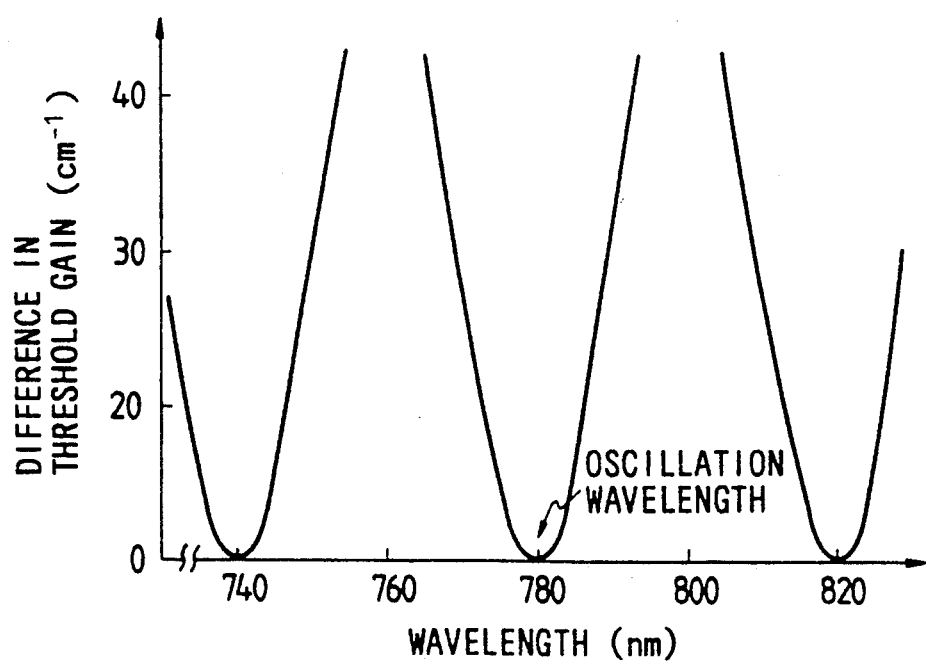

In FIGS. 8a and 8b, there are, respectively, shown the reflectivity and threshold gain difference of the device of this embodiment in relation to the variation in wavelength. FIG. 8a shows that the reflectivity at the oscillation wavelength is 20% and the dielectric film serves as an anti-reflection coating. FIG. 8b reveals that the longitudinal modes having the same threshold gain as that at 780 nm are those at 740 nm and 820 nm. Therefore, the oscillation wavelength becomes stabilized at 780 nm until the gain peak of the active layer is varied from 780 nm by 20 nm.

Figure 9:
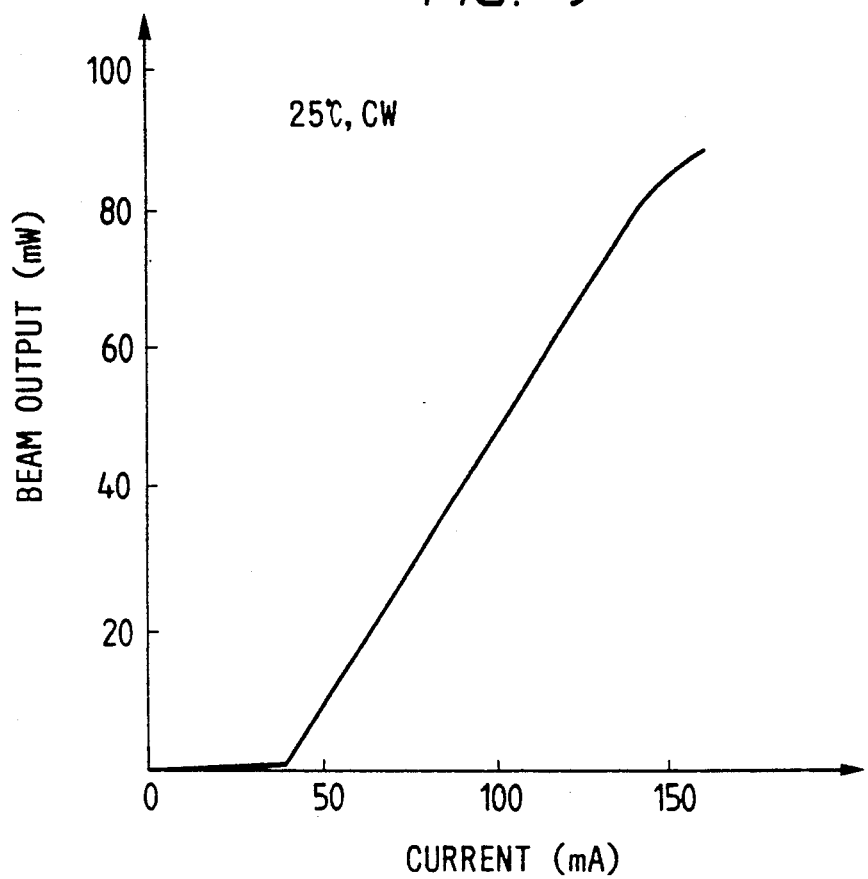
FIG. 9 is a graphical representation of the beam output of the semiconductive laser device of the invention in relation to the variation in electric current.
Figure 10:
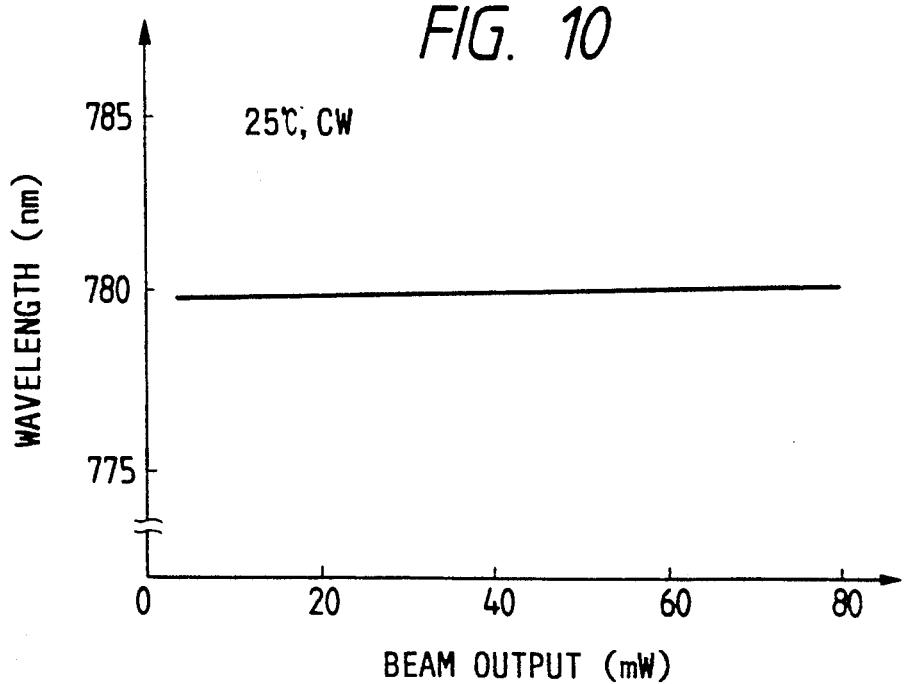
FIG. 10 is a graphical representation of the oscillation wavelength of the semiconductive laser device of the invention in relation to the variation in beam output.
Figure 11:
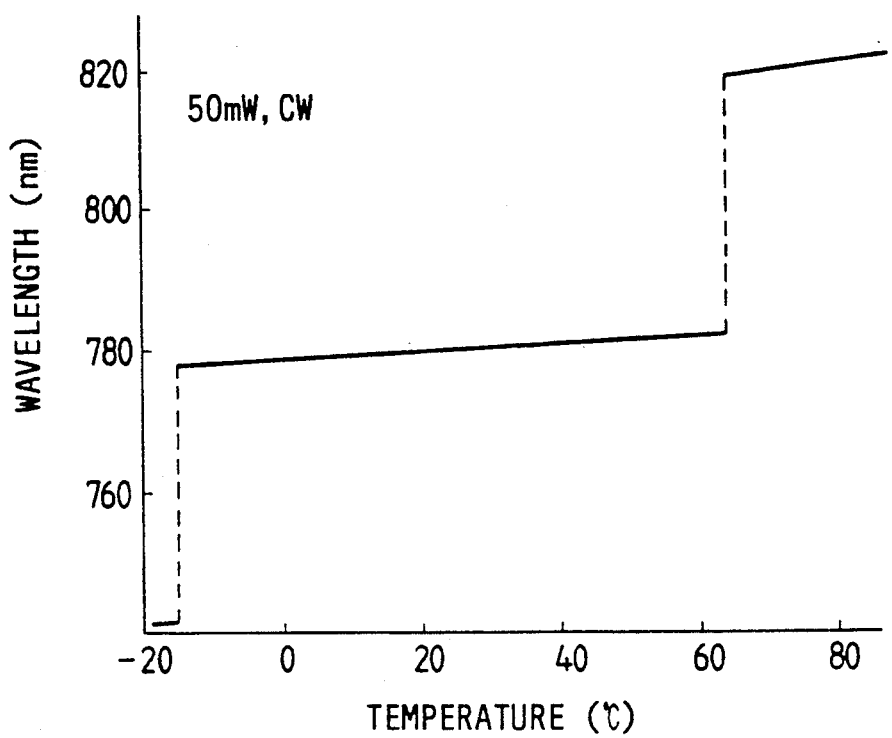
FIG. 11 is a graphical representation of the oscillation wavelength of the semiconductive laser device of the invention in relation to the variation in temperature.

It will be noted that the device of this embodiment is a Fabry-Perot semiconductive laser device having a multi-layered film on an opposite end face. The multi-layered film is made of $Al_2O_3/Si/Al_2O_3/Si$ each having an optical length of 0.25 and has a reflectivity of 94%, which is substantially independent of the wavelength. In FIG. 9, there is shown a current-beam output characteristic of this element determined at 25° C. From the figure, it will be seen that the maximum beam output is 80 mW. FIG. 10 shows the dependence of the wavelength on the beam output, revealing that the oscillation wavelength is substantially constant at 780 nm at which a minimum threshold gain is obtained. FIG. 11 shows the dependence of the wavelength on temperature when the beam output is 50 mW, revealing that the stable oscillation wavelength is ensured over a wide temperature range of about 80° C.

As will become apparent from this embodiment, when a multi-layered film made of two or more dielectric layers is formed on a beam emission surface of laser chip or element wherein at least one layer has a thickness of not less than three times a wavelength in the layer, the laser device obtained ensures a stable wavelength. With a single-layered dielectric film, a low reflectivity is difficult to obtain. In contrast, the multi-layered film wherein the respective dielectric layers have appropriately controlled refractive indices and thicknesses to provide a low reflectivity film enables one to obtain a semiconductive laser device having high output power.

A fourth embodiment of the invention is described wherein the semiconductive laser device of the Fabry-Perot type is described as having at least two resonators or chips. When all the resonators are designed to have a dielectric film at the end face from which a laser beam is emitted, the oscillation wavelength can be more stabilized.

This is particularly described. A GaAlAs semiconductive laser device having a gain peak wavelength of 780 nm is fabricated as having such a structure as illustrated in FIG. 6 except that two end faces of the chips or resonators from which laser beams are emitted are covered with a dielectric film as used in the foregoing embodiments.

In this case, the dielectric film formed on each end face has an optical length of 9 or a thickness of nine times a wavelength of the dielectric film and the device is designed to have the lowest threshold gain (or the highest reflectivity) at a wavelength of 780 nm and a resonator length of 250 μm.

Figure 12:
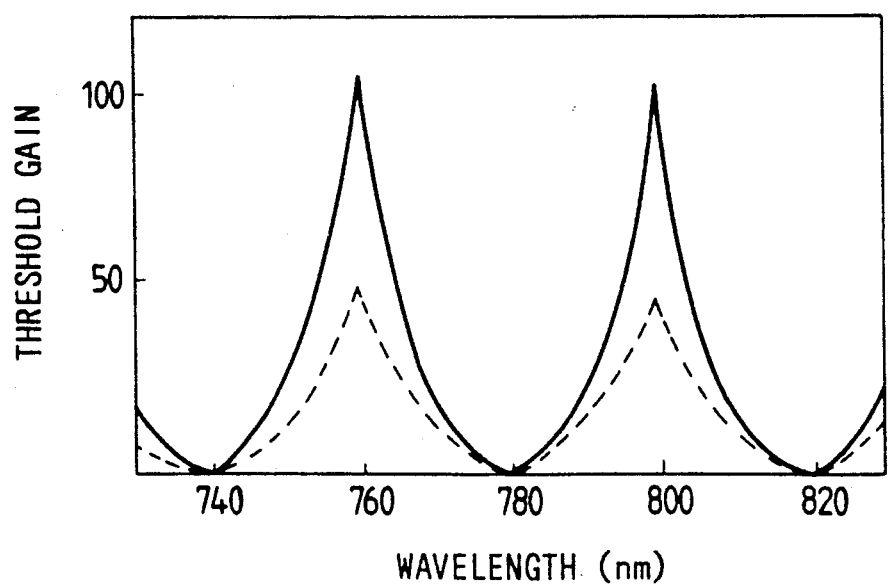
FIG. 12 is a graphical representation of the threshold gain of a semiconductive laser device according to a fourth embodiment of the invention in relation to the variation in oscillation wavelength.

FIG. 12 shows the results of calculation of the threshold gain of the laser device in relation to the variation in wavelength wherein the minimum threshold gain becomes zero only for simplicity. In the figure, the solid line is for the case where both beam emission faces of the laser device are formed with a dielectric film of $Al_2O_3$ in a thickness of 9 expressed by optical length and the broken line is for the case where the semiconductive laser device is fabricated as having one beam emission face covered with an $Al_2O_3$ dielectric film in an optical length of 9 and the other face being cleft.

The threshold gain variation is greater for the solid line than for the broken line.

Figure 13A:
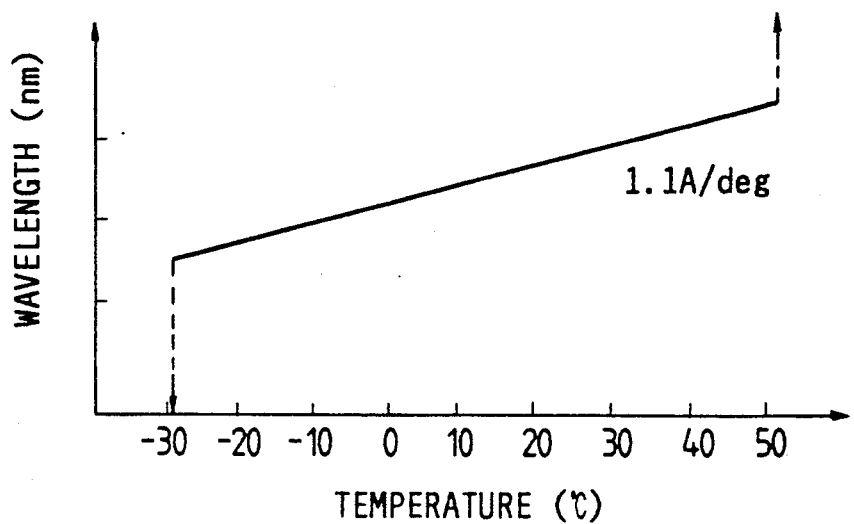
FIG. 13a and FIG. 13b are a graphical representation of the oscillation wavelength in relation to the variation in temperature for an $Al_2O_3$ dielectric film on one end surface and on opposite end surfaces of a resonator chip of the semiconductive laser device of the invention.
Figure 13B:
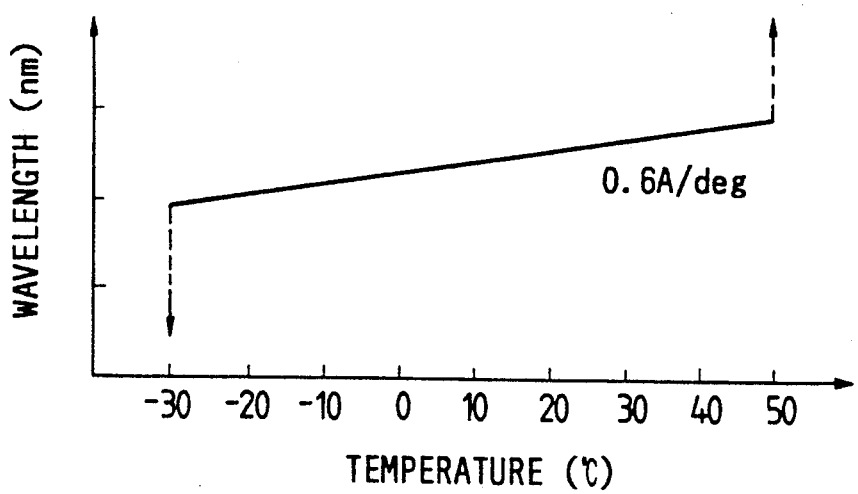

FIGS. 13a and 13b are, respectively, the temperature dependence on the oscillation wavelength for the case of forming the dielectric film only on one end face and the case of forming the dielectric film on both beam emission faces. In both cases, the temperature range where the wavelength is stable is from −30° C. to 50° C. However, the variation in the wavelength relative to the temperature is reduced from 1.1 angstroms/degree to 0.6 angstroms/degree.

In the above arrangement of the laser device, all beam emission end faces are formed with a dielectric film having the wavelength dependence of reflectivity. This dependence is utilized for wavelength selectivity, so that the oscillation wavelength becomes stabilized under conditions where the temperature is varied and the stability of the oscillation wavelength over a practical temperature range can be enhanced without narrowing a stable temperature range.

This is more particularly described. When a dielectric reflective film having a thickness of not less than three times the wavelength in the film is formed only on one of beam emission end faces of a semiconductive laser device, a slight variation of the wavelength results in the variation of reflectivity of from R to $(R+\Delta R)$. The threshold gain increases as shown in the following equation (7)

$$\Delta g_{th} = (\tfrac{1}{L})\ln\{(R+\Delta R)/R\} \quad (7)$$

wherein L represents a cavity length.

On the other hand, when a similar dielectric film is formed on both beam emission end faces of the laser device, the slight variation in the wavelength results in variations of the reflectivity at the respective end faces of from $R_f$ and $R_r$ to $(R_f+\Delta R_f)$ and $(R_r+\Delta R_r)$. The threshold gain increases as shown in the following equation (8)

$$\Delta g_{th}' = (\tfrac{1}{L})\ln[\{(R_f+\Delta R_f)/R_f\}\{R_r+\Delta R_r/R_r\}] \quad (8)$$

If the thicknesses of the dielectric films are equal to each other, $R_f = R_r = R$ and $\Delta R_f = \Delta R_r = \Delta R$. The equation (8) may be rewritten as follows.

$$\Delta g_{th}' = 1/L \ln\{(R+\Delta R)/R\} \quad (9)$$

The variation in the threshold gain in the equation (9) is two times that in the equation (7), revealing that the stability of the wavelength is better.

The equations (7) and (9) are both a function of $\{(R+\Delta R)/R\}$, so that $\lambda_{m+1} - \lambda_m$ does not change, thus leading to no change in the temperature range where the wavelength is stabilized.

In all the embodiments set forth before, although the Febry-Perot type GaAlAs semiconductive laser devices have been described, the formation of dielectric film on beam emission end face or faces may be likewise applied to other types of laser devices such as InGaAsP, InGaAlp and the like laser devices.

What is claimed is:

1. A semiconductive laser device of the type which comprises at least one optical resonator having a dielectric film formed on at least one end face of the resonator from which a laser beam is emitted, said dielectric film having a thickness which is not less than three times a wavelength of the laser beam in the dielectric film whereby the oscillation wavelength of the semiconductive laser is stabilized.

2. A semiconductive laser device according to claim 1, wherein said dielectric film is made of aluminium oxide.

3. A semiconductive laser device according to claim 1, wherein said dielectric film is a multi-layered structure wherein at least one layer of the multi-layered structure has a thickness of not less than three times the wavelength.

4. A semiconductive laser device according to claim 3, wherein said multi-layered structure is a two-layered structure having two layers made of different dielectric materials.

5. A semiconductive laser device according to claim 4, wherein said two layers are made of $Al_2O_3$ and $TiZrO_4$.

6. A semiconductive laser device according to claim 5, wherein the layer of $TiZrO_4$ directly contact the end face.

7. A semiconductive laser device according to claim 1, further comprising another dielectric film formed on the other end face of said resonator.

8. A semiconductive laser device according to claim 7, wherein the dielectric film formed on the opposite end faces has a multi-layered structure.

9. A semiconductive laser device according to claim 1, wherein two resonators are provided and have a dielectric film on a beam emission end face of each resonator in such a way that the thicknesses of the respective dielectric films are substantially equal to each other.

10. A semiconductive laser device of the type which comprises a plurality of optical resonators at least one of which has a dielectric film formed on at least one end face of the at least one resonator from which a laser beam is emitted, said dielectric film having a thickness which is not less than three times a wavelength of the laser beam in the dielectric film whereby the oscillation wavelength of the semiconductive laser is stabilized.

11. A semiconductive laser device according to claim 10, wherein the plurality of the optical resonators have, respectively, on at least one beam emission end face dielectric films having different thicknesses of not less than three times the wavelength.

* * * * *